United States Patent
Muchow et al.

(10) Patent No.: US 11,124,412 B2
(45) Date of Patent: Sep. 21, 2021

(54) MANUFACTURING METHOD FOR A MICROMECHANICAL WINDOW STRUCTURE AND CORRESPONDING MICROMECHANICAL WINDOW STRUCTURE

(71) Applicant: Robert Bosch GmbH, Stuttgart (DE)

(72) Inventors: Joerg Muchow, Reutlingen (DE); Rainer Straub, Ammerbuch (DE); Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/789,503

(22) Filed: Feb. 13, 2020

(65) Prior Publication Data
US 2020/0231433 A1  Jul. 23, 2020

Related U.S. Application Data

(62) Division of application No. 15/743,326, filed as application No. PCT/EP2016/061706 on May 24, 2016, now abandoned.

(30) Foreign Application Priority Data

Jul. 17, 2015 (DE) .......................... 102015213473.3

(51) Int. Cl.
*B81B 7/00* (2006.01)
*B81C 1/00* (2006.01)
(Continued)

(52) U.S. Cl.
CPC ........ *B81B 7/0058* (2013.01); *B81C 1/00103* (2013.01); *B81C 1/00317* (2013.01);
(Continued)

(58) Field of Classification Search
CPC ............ B81C 1/00103; B81C 1/00317; B81C 2201/0154; B81C 2201/0143;
(Continued)

(56) References Cited

U.S. PATENT DOCUMENTS 8,830,557 B2 * 9/2014 Sampsell ............... G02B 5/284
                                                              359/290
2009/0116675 A1    5/2009 Miyoshi
(Continued)

FOREIGN PATENT DOCUMENTS

DE    102010062009 A1    5/2012
DE    102012206858 A1    10/2013
(Continued)

OTHER PUBLICATIONS

International Search Report dated Aug. 1, 2016, of the corresponding International Application PCT/EP2016/061706 filed May 24, 2016.
(Continued)

*Primary Examiner* — Duy Vu N Deo
(74) *Attorney, Agent, or Firm* — Norton Rose Fulbright US LLP; Gerard A. Messina

(57) ABSTRACT

A manufacturing method for a micromechanical window structure including the steps: providing a substrate, the substrate having a front side and a rear side; forming a first recess on the front side; forming a coating on the front side and on the first recess; and forming a second recess on the rear side, so that the coating is at least partially exposed, whereby a window is formed by the exposed area of the coatings.

7 Claims, 4 Drawing Sheets

(51) Int. Cl.
  *G02B 1/14* (2015.01)
  *G02B 26/08* (2006.01)
(52) U.S. Cl.
  CPC . *B81B 2201/042* (2013.01); *B81B 2203/0384* (2013.01); *B81C 2201/0133* (2013.01); *B81C 2201/0143* (2013.01); *B81C 2201/0154* (2013.01); *B81C 2203/0136* (2013.01); *G02B 1/14* (2015.01); *G02B 26/0833* (2013.01)
(58) Field of Classification Search
  CPC .... B81C 2203/0136; B81C 2201/0133; B81B 7/0058; B81B 2201/042; B81B 2203/0384; G02B 26/0833; G02B 1/14
  USPC .......................................................... 216/2
  See application file for complete search history.

(56) References Cited

U.S. PATENT DOCUMENTS

| | | |
|---|---|---|
| 2011/0188140 A1 | 8/2011 | Fiess et al. |
| 2012/0133004 A1 | 5/2012 | Pinter |
| 2012/0140306 A1* | 6/2012 | Pinter ................ G02B 26/0833 359/238 |
| 2013/0285169 A1 | 10/2013 | Pinter |
| 2015/0200105 A1 | 7/2015 | Langa et al. |

FOREIGN PATENT DOCUMENTS

| | | |
|---|---|---|
| DE | 102013211886 A1 | 12/2014 |
| EP | 1748029 A2 | 1/2007 |
| JP | 2005040885 A | 2/2005 |
| JP | 2006106753 A | 4/2006 |
| JP | 2007256419 A | 10/2007 |
| JP | 4180780 B2 | 11/2008 |
| JP | 2011517626 A | 6/2011 |
| JP | 2011523199 A | 8/2011 |

OTHER PUBLICATIONS

The German Future Prize was awarded for ultrashort pulse lasers; http://www.vditz.de/meldung/deutscher-zukunftspreis-fuer-ukp-laser/, Dec. 9, 2013.

* cited by examiner

MANUFACTURING METHOD FOR A MICROMECHANICAL WINDOW STRUCTURE AND CORRESPONDING MICROMECHANICAL WINDOW STRUCTURE

CROSS REFERENCE

The present application is a divisional application of U.S. patent application Ser. No. 15/743,326, filed Jan. 10, 2018, which is a U.S. National Phase of International Application PCT/EP2016/061706, filed May 24, 2016, and claims the benefit under 35 U.S.C. § 119 of German Patent Application No. DE 102015213473.3, filed on Jul. 17, 2015, all of which are hereby incorporated by reference in their entireties.

FIELD

The present invention relates to a manufacturing method for a micromechanical window structure and to a corresponding micromechanical window structure.

BACKGROUND INFORMATION

To protect a wafer including micro-electromechanical (MEMS) components against physical or chemical damage, for example a protective wafer is applied on the wafer including MEMS components, for example by anodic bonding. To protect optical elements, such as micromirrors, protective wafers including windows are provided for this purpose. The windows are coated with optically transparent layers.

A manufacturing method for a device equipped with windows is described in German Patent Application No. DE 10 2013 211 886 A1. As shown in FIG. 4, a window plate 12 is inserted into a recess 11 of a substrate 1 with the aid of sealants and/or adhesives, recess 11 including edges 11a inclined with respect to a front side 4 and a rear side 5 of substrate 1.

A first substrate including micromirror devices is described in European Patent No. EP 1 748 029 A2, on which a second substrate including light-transmitting window elements is attached.

A method for manufacturing an optical window device is described in German Patent Application No. DE 10 2012 206 858 A1. For this purpose, a transparent layer is applied onto a substrate including a recess and subsequently deformed.

Ultrashort pulse lasers are suitable for deliberately structuring or stripping surfaces; for example, the German Future Prize was awarded for ultrashort pulse lasers (communication retrievable from the page http://www.vditz.de/meldung/deutscher-zukunftspreis-fuer-ukp-laser/).

SUMMARY

According to a first aspect, the present invention provides a method for manufacturing a micromechanical window structure, including the steps: providing a substrate, the substrate having a front side and a rear side; forming a first recess on the front side; forming a coating on the front side and on the first recess; and forming a second recess on the rear side, so that the coating is at least partially exposed, whereby a window is formed by the exposed area of the coating.

According to one further aspect, the present invention provides a micromechanical window structure including: a substrate, the substrate having a front side and a rear side, the substrate having a recess area extending from the front side to the rear side; and a window spanning inside the recess area, which is formed of a coating and has the shape of a plane inclined with respect to the front side.

The present invention provides a cost-effective method for manufacturing micromechanical window structures on a substrate. By exposing a coating, a hermetically sealed window is formed, such as may be needed in particular for applications in combination with MEMS components, such as micromirrors.

Separation of windows and insertion with the aid of sealants or adhesives are dispensed with, whereby the method according to the present invention allows the series production of micromechanical window structures.

The micromechanical window structures manufactured using the method according to the present invention ensure a protection of optical elements, such as micromirrors.

By recessing the window in the substrate, the window itself is also protected against damage.

According to one further specific embodiment of the method according to the present invention, the formation of the first recess is carried out in such a way that a recess surface of the first recess has the shape of a plane inclined with respect to the front side. As a result, the optical window is well-suited for allowing light to pass through, for example for the use with micromirrors. The inclination of the window may prevent a first order diffraction reflex from appearing in the center of a micromirror.

According to one further specific embodiment of the method according to the present invention, the formation of the second recess is carried out in such a way that the coating is precisely exposed on the recess surface that has the shape of a plane inclined with respect to the front side. In this way, it may be ensured that the entire window surface is available for allowing light to pass through, for example for the use with micromirrors.

According to one further specific embodiment of the method according to the present invention, the formation of the first recess is carried out with the aid of ultrashort pulse lasers. This ensures a high evenness of the surface of the recess since the removed material does not melt, but directly evaporates and thus no poorly controllable molten mass occurs.

According to one further specific embodiment of the method according to the present invention, the coating is a nitride coating.

According to one further specific embodiment of the method according to the present invention, the coating includes a first undercoating and a second undercoating, the first undercoating being a nitride coating and the second undercoating being an oxide coating. By combining an oxide coating, which has compressive stress, with a nitride coating, which has tensile stress, it is possible to achieve that the coating is under tensile stress and thereby smoothed.

According to one further specific embodiment of the method according to the present invention, a moth eye structure is formed on the coating. In this way, it is possible to decrease the reflection of the window and to increase the transparency of the window.

According to one further specific embodiment of the micromechanical window structure according to the present invention, at least one additional anti-reflection layer is formed on the exposed window area of the coating.

According to one further specific embodiment of the method according to the present invention, the formation of the second recess is carried out by trench etching, KOH etching and/or by milling.

According to one further specific embodiment of the micromechanical window structure according to the present invention, the coating is a nitride coating.

According to one further specific embodiment of the micromechanical window structure according to the present invention, the coating includes a first undercoating and a second undercoating, the first undercoating being a nitride coating and the second undercoating being an oxide coating.

Further features and advantages of specific embodiments of the present invention are derived from the following description with respect to the accompanying drawings.

DETAILED DESCRIPTION OF EXAMPLE EMBODIMENTS

Figure 1A:
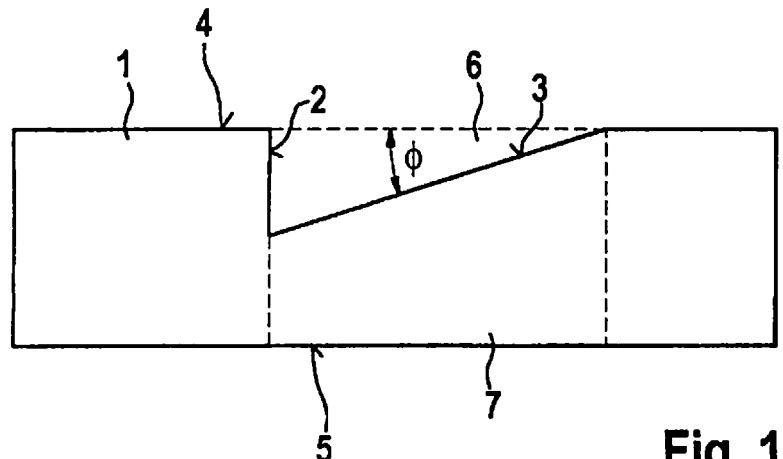
FIGS. 1a through 1c show schematic cross-sectional views to explain a manufacturing method for a micromechanical window structure according to a first specific embodiment of the present invention.

In all figures, identical or functionally equivalent elements and devices were denoted by the same reference numerals, unless indicated otherwise. The numbering of method steps is used for the sake of clarity and is, in particular, not intended to imply a certain chronological sequence, unless indicated otherwise. In particular, multiple method steps may also be carried out simultaneously.

Figure 1B:
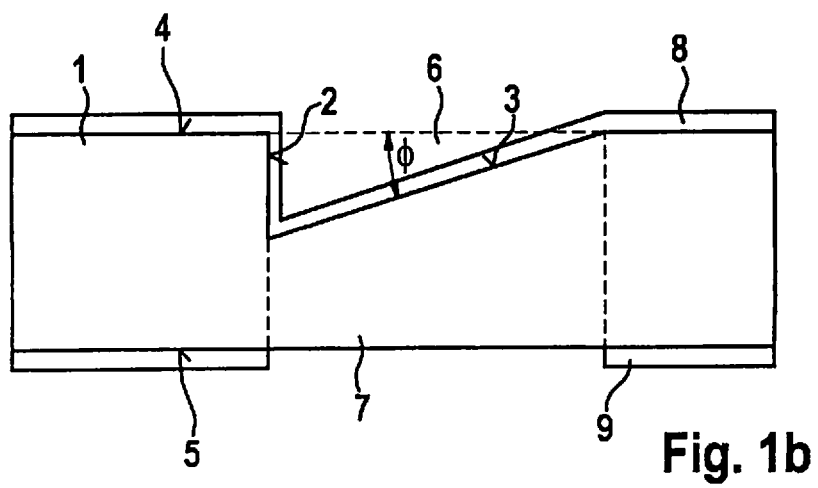
Figure 1C:
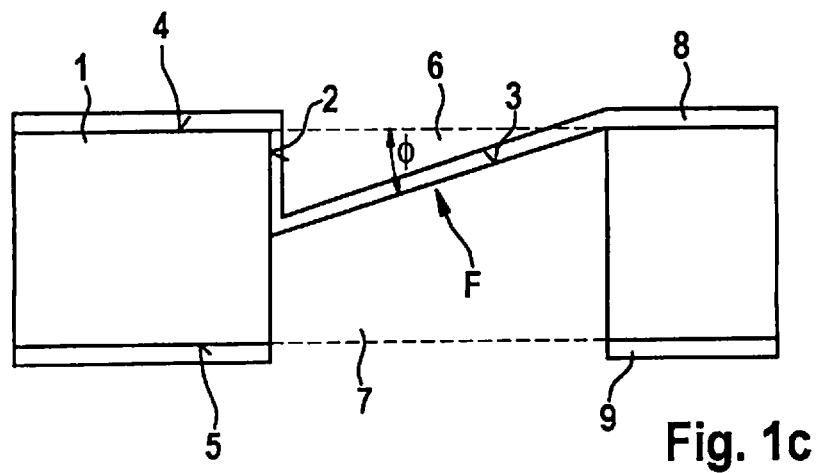

FIGS. 1a through 1c show schematic cross-sectional views to illustrate a manufacturing method for a micromechanical window structure according to a first specific embodiment of the present invention.

In a first method step, a substrate 1, for example a semiconductor substrate, such as a silicon substrate, having a front side 4 and a rear side 5 is provided.

In a second method step, a first recess 6 is formed in substrate 1 on front side 4, for example by KOH etching, trench etching, sand blasting or grinding. Preferably, first recess 6 may also be formed with the aid of an ultrashort pulse laser.

According to the first specific embodiment of the present invention, first recess 6 is wedge-shaped, a first recess surface 2 being perpendicular to front side 4, and a second recess surface 3 being inclined with respect to front side 4 at an angle φ, which is formed between second recess surface 3 and front side 4. Angle φ is greater than zero, for example between 10° and 60°, in particular between 15° and 45°, and particularly preferably between 20° and 40°. If, as described above, an ultrashort pulse laser is used, it may be ensured in particular that first recess surface 2 and second recess surface 3 have great evenness.

However, first recess surface 2 does not have to be perpendicular to front side 4. In particular, first recess surface 2 may be inclined at an angle α, which is formed between first recess surface 2 and front side 4. An inclination of first recess surface 2 may be formed, for example, in that a crystallographic direction of substrate 1, for example of a silicon substrate, is selected in such a way that a <111> crystallographic direction of substrate 1 has an angle of inclination with respect to front side 4.

The shape of first recess 6, however, is not limited to the wedge shape; in particular, first recess 6 may be cuboid, trapezoidal or curved.

Additionally, an evenness of first recess surface 2 and of second recess surface 3 may be improved by an annealing step using forming gas, such as $H_2$, at temperatures above 1000° C.

A volume formed between second recess surface 3 and rear side 5 corresponds to a second recess 7 recessed in a method step following later.

In a third method step, a coating 8, as shown in FIG. 1b, is formed on front side 4, first recess surface 2 and second recess surface 3. The formation of coating 8 may take place, for example, by chemical vapor deposition (CVD), physical vapor deposition (PVD), plasma-enhanced chemical vapor deposition (PECVD), plasma impulse chemical vapor deposition (PICVD), low-pressure chemical vapor deposition (LPCVD) or thermal chemical vapor deposition (TCVD) methods or by thermal oxidation. The formation of coating 8, however, does not have to be limited to these methods and may also take place by other methods or by a combination of multiple methods.

Coating 8 is preferably made up of a transparent or translucent material, for example glass or plastic. For example, coating 8 may be a nitride coating, such as a low-pressure (LP) nitride coating. The material of coating 8, however, does not have to be limited thereto.

On rear side 5, a mask 9 is additionally applied, for example in the same process step, and subsequently structured, so that the portion of rear side 5 belonging to second recess 7 is left exposed. If mask 9 is made up of the same material as coating 8, i.e., coating 8 and mask 9 may be applied in a single work step, time and costs may be saved. However, mask 9 may also be made up of a different material than coating 8 and applied separately.

In a fourth method step of the manufacturing method for a micromechanical window structure according to the first specific embodiment of the present invention, second recess 7 is formed, as shown in FIG. 1c, in such a way that a material of substrate 1 is removed from coating 8 on second recess surfaces 3 from rear side 5. By exposing coating 8, a window F, which is able to allow light to pass through, is created by coating 8 between first recess 6 and second recess 7. In particular, coating 8 on second recess surface 3 covers the full cross-sectional surface of first recess 6 and of second recess 7, which is thereby available for the window.

The formation of recess 7 may take place by trench etching and/or by KOH etching. The formation of recess 7, however, is not limited to these methods; in particular, the formation of recess 7 may take place by milling, with the aid of a laser, for example an ultrashort pulse laser, or by a combination of these methods. In these cases, the method step of attaching a mask 9 may be dispensed with.

Furthermore, for example, it is also possible to remove a material of the substrate 1 only from a portion of coating 8 on second recess surfaces 3 from rear side 5.

In this way, as illustrated in FIG. 1c, a micromechanical window structure according to a first specific embodiment of the present invention is formed, manufactured as recited in claim 1. A substrate 1 has a front side 4 and a rear side 5, substrate 1 including a recess area 6, 7 extending from front side 4 to rear side 5. A window F, which is made up of a coating 8 and has the shape of a plane inclined with respect to the front side, spans inside recess area 6, 7. According to the first specific embodiment, recess area 6, 7 is cuboid, the lateral surfaces being perpendicular to front side 4 and rear side 5. Recess 6, 7, however, does not have to be cuboid and may in particular have a trapezoidal cross section, a general polygonal cross section or a curved cross section.

According to the first specific embodiment, the coating also extends across first recess surface 2 and across front side 4. However, the present invention is not limited to this case; in particular, the coating may be absent on front side 4.

Figure 2A:
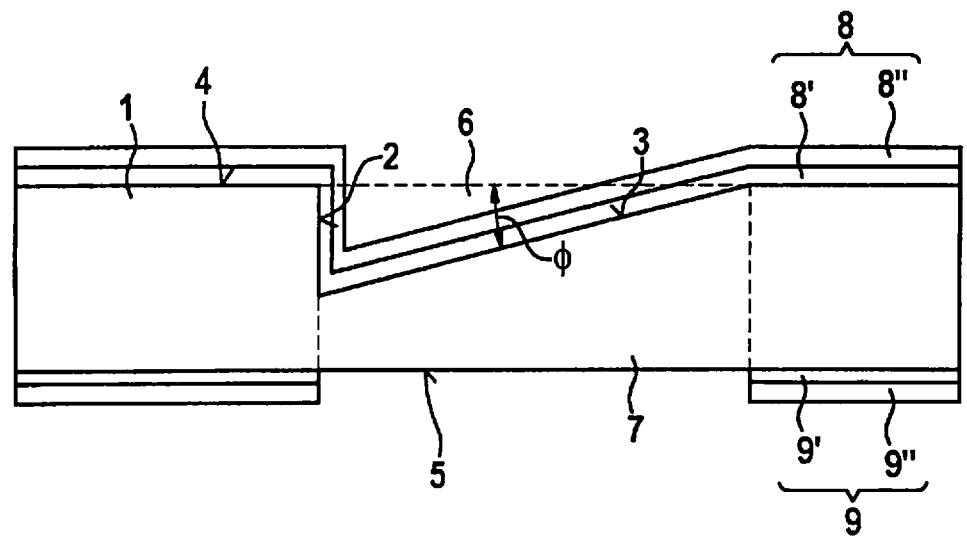
FIGS. 2a and 2b show schematic cross-sectional views to explain a manufacturing method for a micromechanical window structure according to a second specific embodiment of the present invention.
Figure 2B:
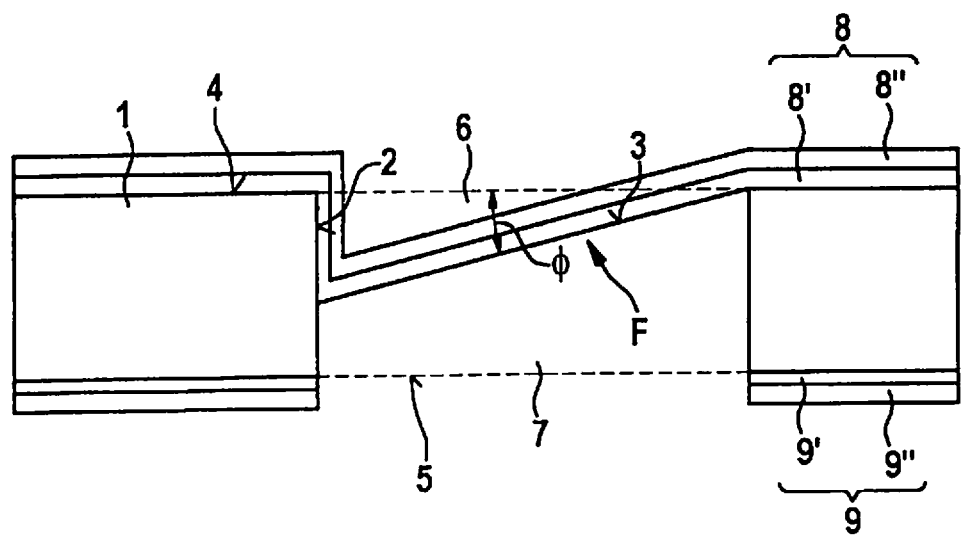

FIGS. 2a, 2b show a schematic cross-sectional view to illustrate a manufacturing method for a micromechanical window structure according to a second specific embodiment of the present invention.

In contrast to the manufacturing method for a micromechanical window structure according to the first specific embodiment of the present invention, coating 8 is divided into a first undercoating 8' and a second undercoating 8", first undercoating 8' first being formed on front side 4, first recess surface 2 and second recess surface 3, and thereafter second undercoating 8" being formed on first undercoating 8'.

First undercoating 8' and second undercoating 8" are preferably made up of a transparent or translucent material, for example glass or plastic. For example, first undercoating 8' may be an oxide coating, and, for example, second undercoating 8" may be a nitride coating, for example an LP nitride coating; however, the material of first undercoating 8' and of second undercoating 8" does not have to be limited thereto.

In contrast to the manufacturing method for a micromechanical window structure according to the first specific embodiment of the present invention, mask 9 may also be divided into a first sub-mask 9' and a second sub-mask 9", first sub-mask 9' first being formed on rear side 5 and subsequently second sub-mask 9" being formed on first sub-mask 9', and subsequently first sub-mask 9' and second sub-mask 9" being structured in such a way that the portion of rear side 5 belonging to second recess 7 is left exposed.

In particular, first sub-mask 9' may be made of the same material as first undercoating 8', and second sub-mask 9" may be made of the same material as second undercoating 8", so that first sub-mask 9' may be formed simultaneously with first undercoating 8', and second sub-mask 9" may be formed simultaneously with second undercoating 8", whereby time and costs may be saved.

The material of first sub-mask 9' and the material of second sub-mask 9", however, may differ from the materials of first undercoating 8' and of second undercoating 8".

The exemplary specific embodiments of the present invention are not limited to these options. In particular, coating 8 may be made up of a first undercoating 8' and a second undercoating 8"; however, mask 9 may be made up of only one sub-mask. Moreover, coating 8 may be made up of more than two undercoatings, and mask 9 may be made up of more than two sub-masks, and the number of undercoatings of coating 8 and the number of sub-masks of mask 9 do not have to be the same.

As shown in FIG. 2b, in a further step of the manufacturing method for a micromechanical window structure according to the second specific embodiment of the present invention, second recess 7 is formed in such a way that a material of substrate 1 is stripped from coating 8 on second recess surface 3 from rear side 5. By exposing coating 8, a window F, which is able to allow light to pass through, is created by coating 8 between first recess 6 and second recess 7. The formation of second recess 7 may take place according to one of the above-mentioned methods.

As illustrated in FIG. 2b, in this way a micromechanical window structure according to a second specific embodiment of the present invention is formed, manufactured as recited in claim 1. In contrast to the first specific embodiment, as illustrated in FIG. 1c, the second specific embodiment includes a first undercoating 8' and a second undercoating 8", it being possible in particular for first undercoating 8' to be a nitride coating and for second undercoating 8" to be an oxide coating.

Figure 3:
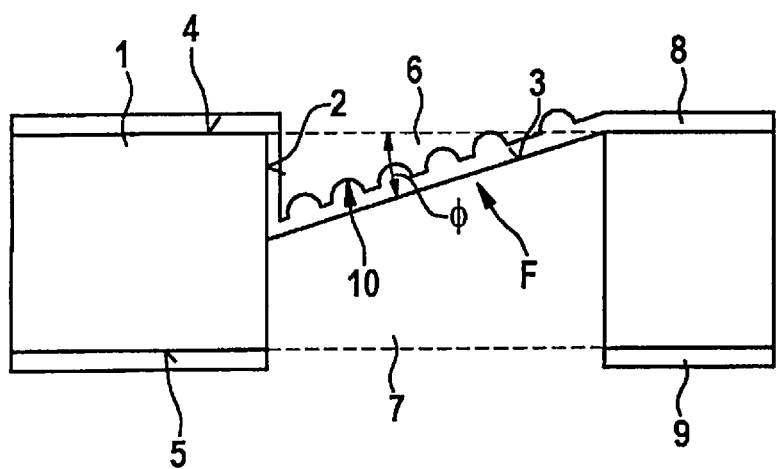
FIG. 3 shows a schematic cross-sectional view of a micromechanical window structure according to a third specific embodiment of the invention.
Figure 4:
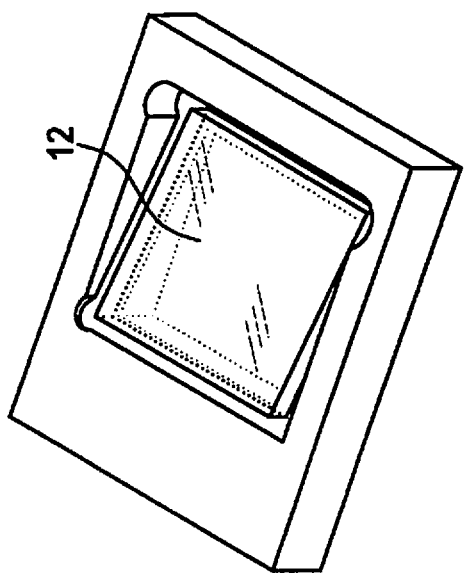
FIG. 4 shows a schematic top view of a micromechanical window structure according to one specific embodiment of the related art.
Figure 4:
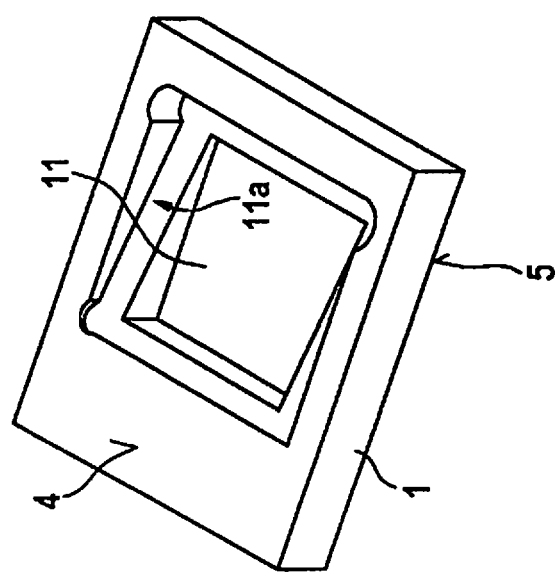

FIG. 3 shows a schematic cross-sectional view to illustrate a manufacturing method for a micromechanical window structure according to a third specific embodiment of the present invention.

In contrast to the manufacturing method for a micromechanical window structure according to the first specific embodiment of the present invention, coating 8, in particular a portion of coating 8 formed on second recess surface 3, is at least sectionally provided with a nanostructured surface. The nanostructured surface may in particular be a moth eye structure 10. Moth eye structure 10 is made up of small elevations, whose distance may be selected in the order of magnitude of the wavelength range of the light used, whereby it may be achieved that a reflection property of coating 8 is reduced, and light may be better transmitted.

According to one further preferred specific embodiment of the present invention, at least one further anti-reflection coating may be formed on window F. The at least one anti-reflection coating may be a metal coating, for example, which may have a thickness in the range of several nanometers, a plastic coating, a silicon coating or a similar coating. The formation of the coating may be carried out by sputtering, with the aid of a CVD method or with the aid of a dipping method.

Although the present invention has been described above based on preferred exemplary embodiments, it is not limited thereto, but is modifiable in a variety of ways. The present invention may in particular be changed or modified in multiple ways without departing from the core of the present invention.

What is claimed is:

1. A micromechanical window structure, comprising:
   a substrate having a front side and a rear side, the substrate including a recess area extending from the front side to the rear side; and
   a window, spanning inside the recess area, which is formed by a coating and has a shape of a plane inclined with respect to the front side, wherein the coating includes a first undercoating and a second undercoating, the first undercoating being a nitride coating and the second undercoating being an oxide coating, and the coating is at least one of: transparent, or translucent;
   wherein the recess area includes a surface perpendicular to the front side of the substrate, and a portion of the coating is formed on the surface of the recess area perpendicular to the front side of the substrate.

2. The micromechanical window structure as recited in claim 1, wherein the window is optically transparent.

3. The micromechanical window structure as recited in claim 1, wherein the coating of the window is at least partially exposed by the recess area on the rear side.

4. The micromechanical window structure as recited in claim 1, wherein the window spans the recess area.

5. The micromechanical window structure as recited in claim 1, wherein the coating has a tensile stress.

6. The micromechanical window structure as recited in claim 1, wherein the first undercoating has a tensile stress and the second undercoating has a compressive stress.

7. The micromechanical window structure as recited in claim 6, wherein the coating has a tensile stress.

* * * * *